United States Patent
Chae et al.

(10) Patent No.: US 7,187,030 B2
(45) Date of Patent: Mar. 6, 2007

(54) SONOS MEMORY DEVICE

(75) Inventors: Soo-doo Chae, Seongnam-si (KR);
Chung-woo Kim, Seongnam-si (KR);
Jo-won Lee, Suwon-si (KR);
Moon-kyung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 10/867,706

(22) Filed: Jun. 16, 2004

(65) Prior Publication Data

US 2004/0251490 A1  Dec. 16, 2004

(30) Foreign Application Priority Data

Jun. 16, 2003  (KR) ............... 10-2003-0038681

(51) Int. Cl.
*H01L 29/792*  (2006.01)

(52) U.S. Cl. ................................. 257/324

(58) Field of Classification Search ......... 257/314–324
See application file for complete search history.

(56) References Cited

U.S. PATENT DOCUMENTS

| | | | |
|---|---|---|---|
| 6,847,556 B2* | 1/2005 | Cho | 365/185.28 |
| 2001/0021133 A1* | 9/2001 | Iijima | 365/201 |
| 2004/0257880 A1* | 12/2004 | Yeh et al. | 365/185.29 |

* cited by examiner

*Primary Examiner*—Cuong Nguyen
(74) *Attorney, Agent, or Firm*—Lee & Morse P.C.

(57) ABSTRACT

A SONOS memory device, and a method of erasing data from the same, includes injecting charge carriers of a second sign into a trapping film, which traps charge carriers of a first sign to store data therein. The charge carriers of the second sign are generated by an electric field formed between one of a first and second electrodes contacting at least one bit line and a gate electrode contacting a word line. A blocking film may be provided between the gate electrode and the trapping film. The charge carriers of the second sign may be hot holes. This erasing improves erasing speed, thereby improving performance of the SONOS memory device.

16 Claims, 8 Drawing Sheets

ERASING TIME (sec.)

SONOS MEMORY DEVICE

BACKGROUND OF THE INVENTION

1. Field of the Invention

The present invention relates to a SONOS memory device and a method of erasing data therefrom. More particularly, the present invention relates to a SONOS memory device in which an erasing speed is improved by using hot holes and a method of erasing data therefrom.

2. Description of the Related Art

FIGS. 1A and 2A illustrate cross-sectional views showing a principle of recording information to and erasing information from a memory cell of a conventional silicon oxide nitride oxide silicon (SONOS) flash EEPROM (Electrically Erasable and Programmable Read Only Memory). FIGS. 1B and 2B are schematic drawings illustrating energy band gaps when recording information to and erasing information from the memory cell of the EEPROM depicted in FIGS. 1A and 2A.

Referring to FIGS. 1A and 2A, the conventional SONOS flash EEPROM includes a p-Si substrate 1, a source electrode 2 and a drain electrode 3 formed in the substrate 1, and a tunnel oxide film 4, a nitride film 5, a blocking oxide film 6 and a poly-Si gate electrode 7 stacked sequentially on the substrate 1. The tunnel oxide film 4, the nitride film 5, and the blocking oxide film 6 in a SONOS flash memory are collectively referred to as an oxide/nitride/oxide (ONO) film.

Referring to FIGS. 1A and 1B, in order to record information in the SONOS flash EEPROM, the p-Si substrate 1 is grounded and a predetermined positive voltage (VG>0) is applied to the gate electrode 7. Then, an electric field is formed between the substrate 1 and the gate electrode 7, and a Fowler-Nordheim (FN) current is generated across the tunnel oxide film 4.

Electrons traveling between the source electrode 2 and the drain electrode 3 are injected into the nitride film 5 by tunneling through an energy barrier of the tunnel oxide film 4. The electrons e that enter the nitride film 5 are blocked by the blocking oxide film 6 and information is recorded in the memory cell by trapping the electrons in the nitride film 5.

Referring to FIGS. 2A and 2B, when erasing information recorded in the SONOS flash EEPROM, an electric field, in an opposite direction to that used when recording information, is formed by applying a predetermined negative voltage (VG<0) to the gate electrode 7 after grounding the substrate 1. Accordingly, the FN current across the tunnel oxide film 4 is formed in the opposite direction to the direction of the FN current when recording. Thus, the information stored in the nitride film 5 is erased by moving the electrons e from the nitride film 5 to the substrate 1 by tunneling through the tunnel oxide film 4 by the FN current.

When erasing data using a FN current, erasing speed can be reduced by electrons e moving from the gate electrode 7 to the blocking oxide film 6. In a NOR flash memory device, electrons e are partially charged using a Channel Hot Electron Injection (CHEI) method for recording data and a Hot Hole Injection (HHI) method is used for erasing data. However, in the case of a NAND flash memory, a FN current is used for recording and erasing data, since not all of the electrons scattered in the nitride film can be erased using the HHI method.

FIG. 3 is a graph illustrating a relationship between recording time and threshold voltage Vth according to a variation of a gate voltage when data is recorded using a FN current in the SONOS flash EEPROM. FIG. 4 is a graph illustrating a relationship between erasing time and threshold voltage Vth according to a variation of a gate voltage when data is erased using a FN current in the SONOS flash EEPROM.

Comparing FIGS. 3 and 4, it can be seen that the erasing time is longer than the recording time at the same threshold voltage Vth. This longer erasing time is assumed to arise from a phenomenon caused by electrons injected from the gate electrode, interfering with the erasing.

SUMMARY OF THE INVENTION

Therefore, the present invention is directed to a SONOS memory device and a method of erasing the same that substantially overcomes one or more or other disadvantages of the related art.

It is a feature of the present invention to provide a SONOS memory device having a high erasing speed. It is another feature of the present invention to provide a high-speed method of erasing data from a SONOS memory device.

At least one of the above and other features and advantages may be realized by providing a silicon oxide nitride oxide silicon (SONOS) memory device connected to a bit line and a word line, including a substrate having first and second electrodes formed therein, at least one of the first and second electrodes electrically connected to the bit line, a tunnel oxide layer on the substrate, a nitride film on the tunnel oxide layer, and a gate electrode on the nitride film and electrically connected to the word line. Data is stored in the SONOS memory device by trapping charge carriers of a first sign in the nitride film and data is erased from the SONOS memory device by injecting charge carriers of a second sign, opposite the first sign, into the nitride film across the tunnel oxide layer. The charge carriers of the second sign are generated by an electric field formed between at least one of the first and second electrodes and at least one of the nitride film and the bit line. The charge carriers of the second sign may be hot holes.

A voltage of a first polarity may be applied to each of the first and the second electrodes and a voltage of a second polarity, opposite the first polarity, may be applied to the gate electrode. The voltage of the first polarity applied to each of the first and the second electrodes may have a same value for both the first and second electrodes. The bit line may contact one of the electrodes such that charge carriers of the second sign from one of the first and the second electrode can be injected into the bit line. The bit line includes a first bit line and a second bit line respectively contacting the first and the second electrodes such that charge carriers of the second sign from the first and second electrodes can be injected into the first and second bit lines.

The SONOS memory device may further include a blocking oxide film for shielding electron tunneling, the blocking oxide film being interposed between the nitride film and the gate electrode. Data may be recorded by tunneling electrons of a Fowler-Nordheim current into the nitride film across the tunnel oxide layer. A negative voltage may be applied to the gate electrode. Data may be erased by tunneling the charge carriers of the second sign into the nitride film by a Fowler-Nordheim current flowing across the tunnel oxide layer. The first and second electrodes may have a channel length of less than about 100 nm.

At least one of the above and other features and advantages of the present invention may be realized by providing a method of erasing data in a memory device connected to a word line and a bit line, the memory device including a trapping layer in which charge carriers of a first sign are stored and a gate electrode contacting the word line, the method including applying a predetermined voltage of a first polarity to at least one of a first electrode and a second electrode of the memory device contacting the bit line, and forming an electric field between one of the first and second electrodes and the gate electrode by applying a predetermined voltage of a second polarity, opposite the first polarity, to the gate electrode, thereby enabling charge carriers of a second sign, opposite the first sign, generated by at least one of the first and second electrodes to be injected into the trapping layer. The charge carriers of the second sign may be hot holes.

A voltage of the first polarity may be applied to one of the first and second electrodes and another of the first and second electrodes may be grounded. The bit line may include a first bit line and a second bit line, the first and second bit lines respectively contacting the first and the second electrodes, and a same voltage of the first polarity may be applied to the first and second bit lines. The method may further include shielding movement of charge carriers between the trapping film and the gate electrode. The first and second electrodes may have a channel length of less than 100 nm. The trapping layer may be a nitride film.

At least one of the above and other features and advantages of the present invention may be realized by providing an array of silicon oxide nitride oxide silicon (SONOS) memory devices, including at least a first memory device and a second memory device, each memory device being connected to a bit line and a word line, and including first and second electrodes, at least one of the first and second electrodes electrically connected to the bit line, a tunnel oxide layer on the substrate, a nitride film on the tunnel oxide layer, and a gate electrode on the nitride film and electrically connected to the word line. Data is stored in the SONOS memory device by trapping charge carriers of a first sign in the nitride film and data is erased from the SONOS memory device by injecting charge carriers of a second sign, opposite the first sign, into the nitride film across the tunnel oxide layer. The charge carriers of the second sign are generated by an electric field formed between at least one of the first and second electrodes and at least one of the nitride film and the bit line. The second electrode of the first memory device serves as the first electrode of the second memory device. The charge carriers of the second sign may be hot holes.

The first and second memory devices may be connected to a single bit line. The bit line may include a first bit line and a second bit line, respectively connected to each of the first and second electrodes. The array may further include a third SONOS memory device sharing the word line of one of the first and second SONOS memory devices.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

This application claims the priority of Korean Patent Application No. 2003-38681 filed on Jun. 16, 2003, in the Korean Intellectual Property Office, entitled: "SONOS Memory Device and Method of Erasing Data from the Same," the disclosure of which is incorporated herein in its entirety by reference.

Figure 5A:
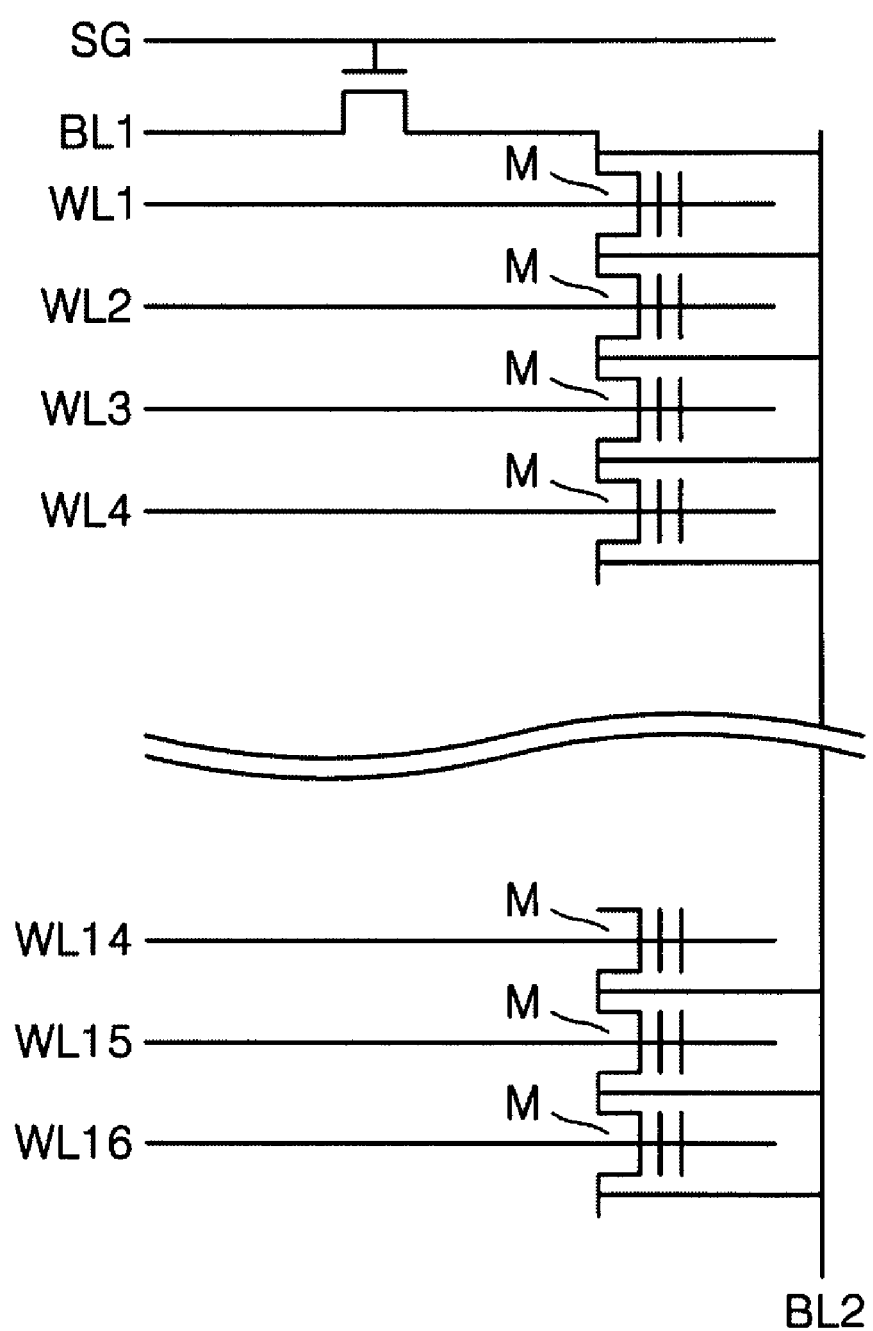
FIG. 5A is a circuit diagram illustrating a configuration of a SONOS memory device according to an embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout FIG. 5A is a circuit diagram illustrating a configuration of a SONOS memory device according to an embodiment of the present invention. Referring to FIG. 5A, the SONOS memory device includes a plurality of memory cells M each including a stacked type gate. The memory cells M arranged in a columnar direction are connected in series sharing first and second electrodes of a metal-oxide-semiconductor (MOS) transistor, i.e., source and drain electrodes. One of the source electrode and the drain electrode of the memory cells M is co-connected to a first bit line BL1 by a select gate transistor SG.

In the memory device of according to an embodiment of the present invention, electrodes that are not connected to the first bit line BL1 are connected to a second bit line BL2. When there is no second bit line BL2, hot holes are injected from whichever one of the electrodes is connected to the first bit line BL1. When the second bit line BL2 is present, hot holes can be injected from both the source electrode and the drain electrode. Gate electrodes of the memory cell M are respectively connected to word lines WL1, WL2, WL3, . . . WL16.

Figure 5B:
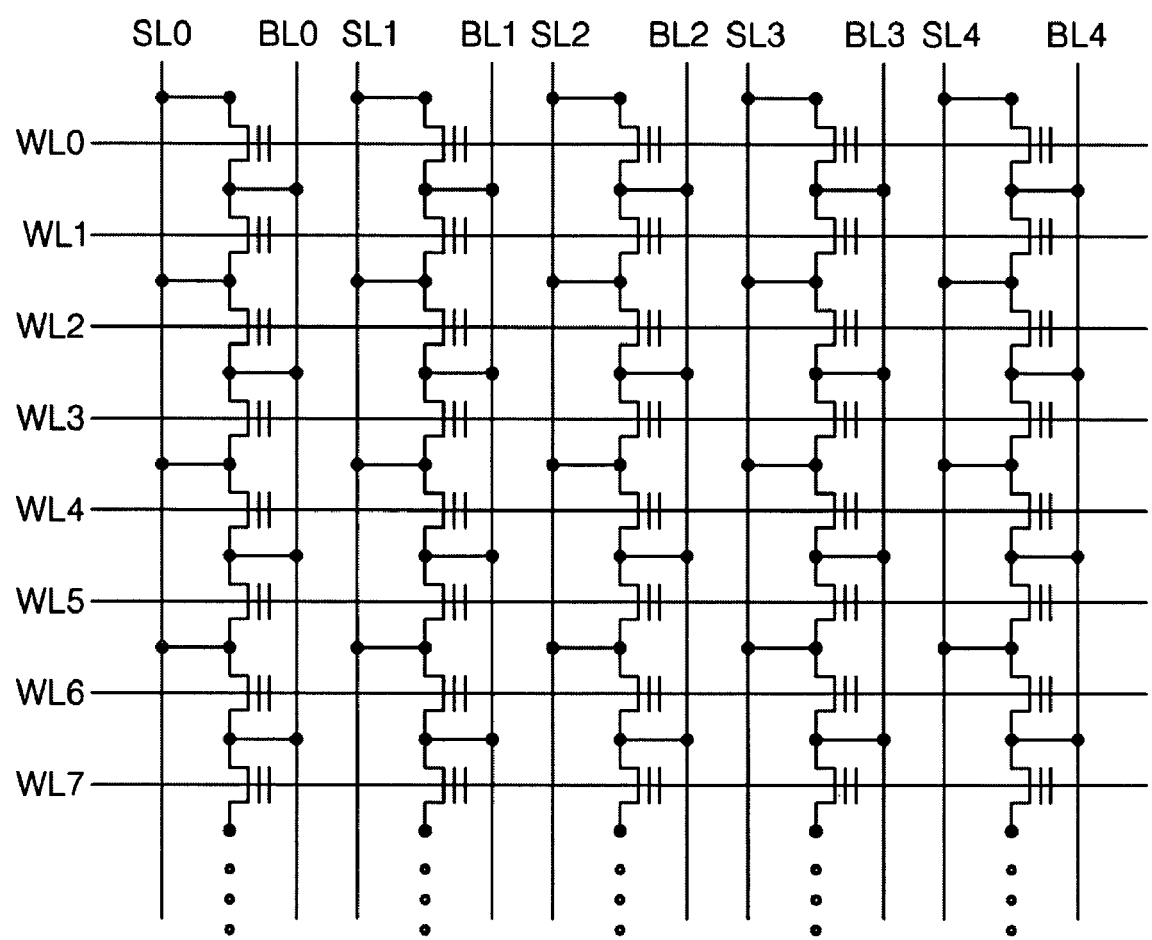
FIG. 5B is a circuit diagram illustrating a configuration of a SONOS memory array according to an embodiment of the present invention.

FIG. 5B is a circuit diagram illustrating a configuration of a SONOS memory array according to an embodiment of the present invention. An array of a plurality of memory cells each having a stacked gate structure is shown in FIG. 5B.

As in the SONOS memory device of FIG. 5A, the memory cells arranged in a columnar direction are connected to one another by sharing first and second electrodes, i.e., source and drain electrodes, of a MOS transistor. The first electrode, e.g., the source electrode, is commonly connected to source lines SL0, SL1, SL2, . . . (hereinafter, collectively "the source lines SL"), and the second electrode, e.g., the drain electrode, is commonly connected to bit lines BL0, BL1, BL2, . . . (hereinafter, collectively "the bit lines BL"). Gate electrodes of memory cells arranged in a row direction are commonly connected to word lines WL0, WL1, WL2, . . . (hereinafter, collectively "the word lines WL").

Figure 1A:
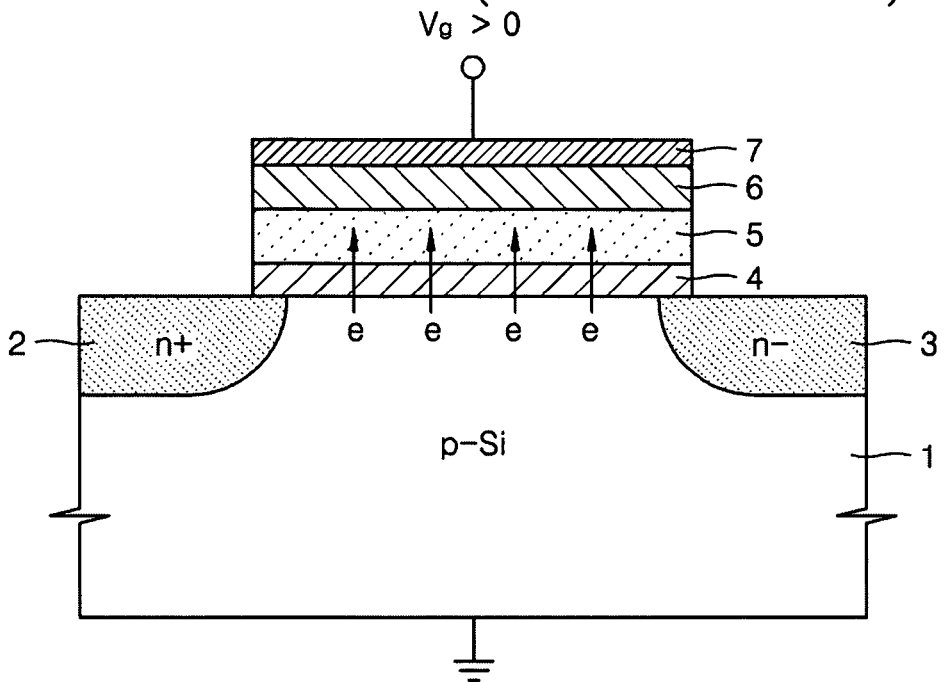
FIG. 1A illustrates a cross-sectional view of a principle of recording information in a conventional SONOS flash EEPROM.
Figure 1B:
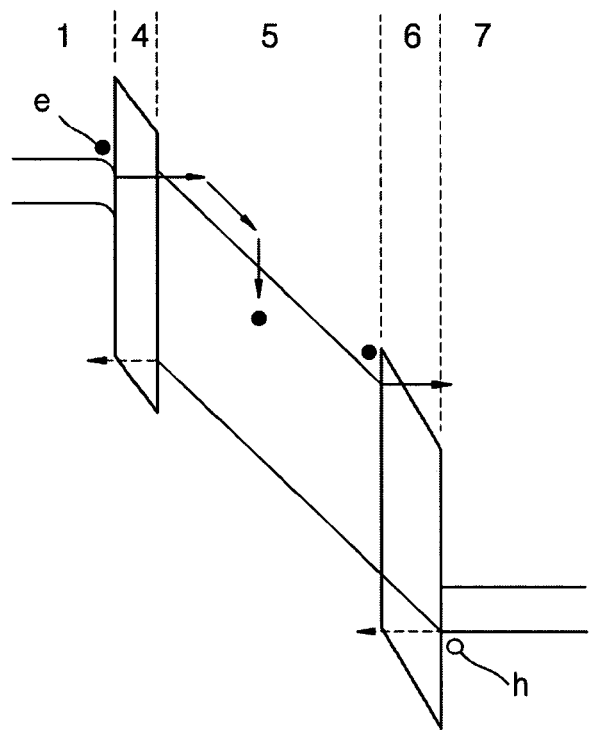
FIG. 1B schematically shows an energy band when recording using the method illustrated by FIG. 1A.
Figure 2A:
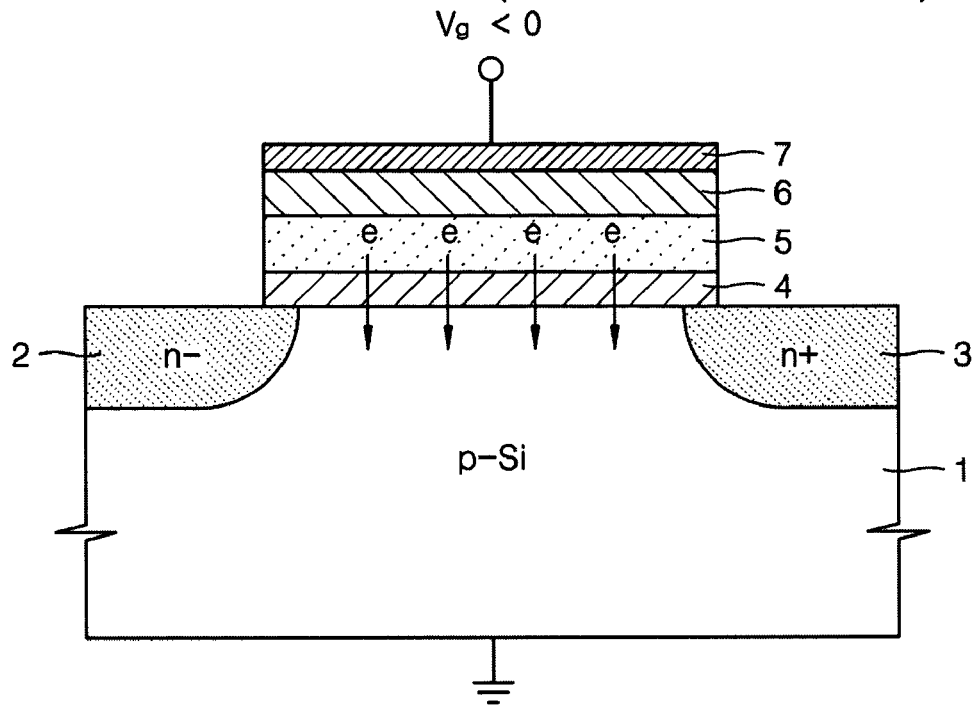
FIG. 2A illustrates a cross-sectional view showing a principle of erasing information in a conventional SONOS flash EEPROM.
Figure 2B:
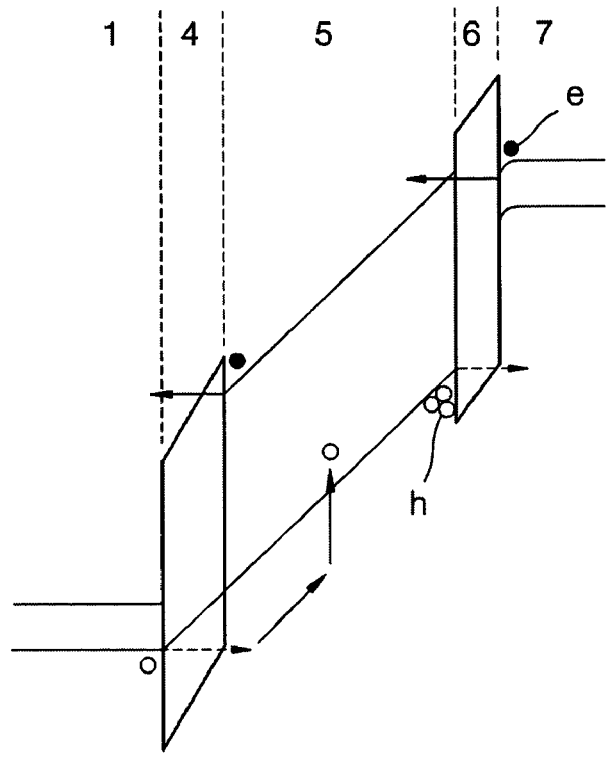
FIG. 2B schematically shows an energy band when erasing using the method illustrated by FIG. 2A.
Figure 3:
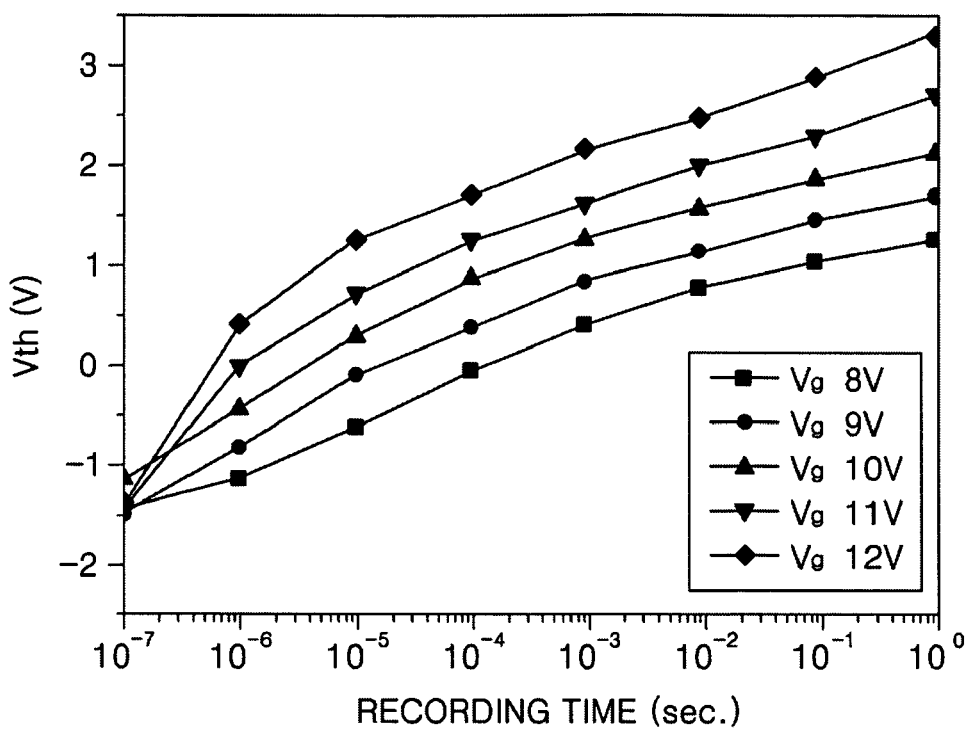
FIG. 3 is a graph illustrating a relationship of a recording time and threshold voltage Vth according to a variation of a gate voltage Vg in a SONOS flash EEPROM.
Figure 4:
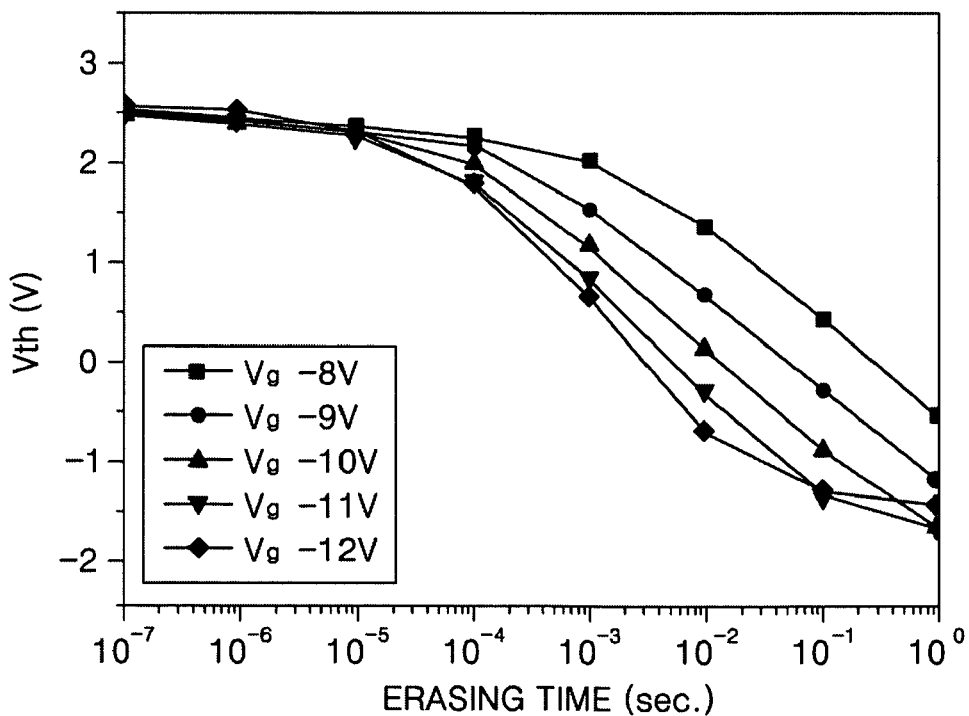
FIG. 4 is a graph illustrating a relationship of erasing time and threshold voltage Vth according to a variation of a gate voltage Vg in a SONOS flash EEPROM.

The source lines SL are bit lines connected to the source electrode and are distinguished from the bit lines BL connected to the drain electrode. In other words, the source lines SL and the bit lines BL in FIG. 5B respectively correspond to the first and second bit lines BL1 and BL2 of FIG. 5A. The memory cells M may have a structure as shown in FIG. 1A or 2A and may be arranged as shown in FIG. 5A or 5B. In accordance with an embodiment of the present invention, information can be erased from these memory cells, which has a particular address, by applying a voltage to the source, drain, and gate electrodes.

Figure 6:
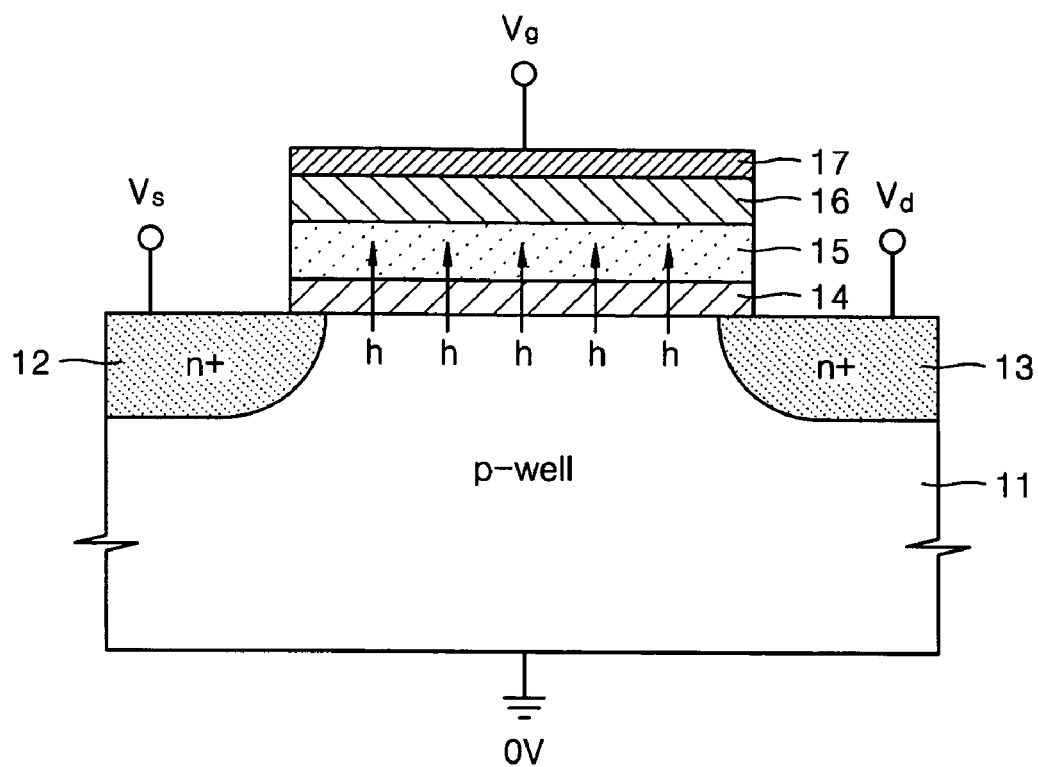
FIG. 6 illustrates a cross-sectional view showing a principle of erasing information from a SONOS memory device according to an embodiment of the present invention.

FIG. 6 illustrates a cross-sectional view showing a principle of erasing data from a SONOS memory device according to an embodiment of the present invention.

Conventionally, data is recorded on a SONOS memory device such that the first and the second electrodes, i.e., the source and drain electrodes 12 and 13, and the substrate 11 are grounded as depicted in FIG. 1A, and a FN current is generated in the tunnel oxide film 14 by applying a positive high voltage VG to the gate electrode 17. Then, electrons of the FN current are injected into the floating gate, i.e., a nitride film, from a front face of a channel, thereby recording data in the SONOS memory device. The conventional classification of injection of electrons into the nitride film as "recording" is arbitrary. In other words, information can be "erased" by injecting electrons into the nitride film, and information can be "recorded" by removing electrons, i.e., injecting holes. More generally, either erase or record operation may be realized by altering the electronic properties of the memory by changing the allotment of charge carriers, i.e., holes or electrons, in the trapping layer. Which of these charge carriers are assigned as the storage mechanism will determine the polarity of the voltage used in the erasing and recording. Hereinafter, the injection of electrons into the nitride film 15 will be referred to as an information recording operation, and the erasing of electrons (injection of holes) will be referred to as an information erasing operation.

Thus, to erase data, the electrons stored in the nitride film 15 must be removed. For this purpose, after grounding the p-well substrate 1, a strong electric field is formed between the gate electrode 17 and one of the source and drain electrodes 12 and 13 by applying a positive voltage to one of the n+ type first and second electrodes, i.e., the source and drain electrodes 12 and 13, and applying a negative voltage to the gate electrode 17. At this time, if a predetermined positive voltage is applied to the bulk substrate 11, a more effective electric field can be formed.

Alternatively, hot holes can be formed by forming a strong electric field between the source and drain electrodes 12 and 13 and the gate electrode 17 by simultaneously applying positive voltages Vs and Vd to the source and drain electrodes 12 and 13 and applying a negative voltage Vg to the gate electrode 17. The voltage Vs applied to the source and the voltage Vd applied to the drain may be the same, and in this case, a strong electric field can also be effectively achieved by applying a predetermined positive voltage to the substrate 1.

The hot holes h accelerated by the strong electric field are injected into the nitride film 15 by passing through the tunnel oxide film 14. The hot holes h injected to the nitride film 15 erase data by offsetting the negative charge through an electrical reaction with electrons. The SONOS memory device of an embodiment of the present invention uses a Hot Hole Injection (HHI) method in which hot holes h are injected to erase data. Additionally, the conventional method of erasing electrons using the FN current can be performed together with the HHI method.

In a conventional NAND flash memory device, the HHI method cannot be used for erasing data because the erase operation is carried out only locally by generating hot hole injection lines with lengths of about 40~60 nm. However, in the SONOS memory device of an embodiment of the present invention, the electrons scattered in the nitride film 15 can be offset using the HHI for a number of reasons. First, the channel length between the source and the drain electrodes 12 and 13 is less than about 100 nm. Second, the hot holes are injected from both of the source and drain electrodes 12 and 13. Third, a total length of each of the hot holes passing through the tunnel oxide film is greater than about 100 nm. Particularly, when a silicon on insulator (SOI) substrate is used in a system on chip (SoC), the erasing method using a FN current is not effective because the tunnel oxide film 14 is too thick. In this case, the HHI method of an embodiment of the present invention can be used to effectively eject electrons.

Figure 7A:
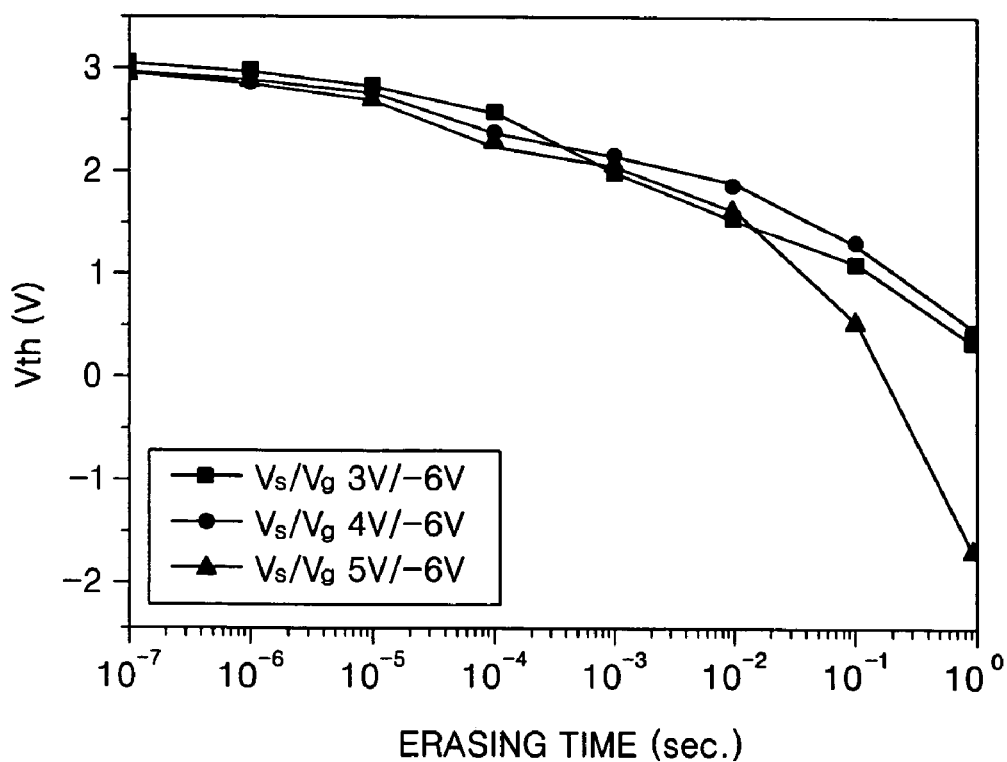
FIG. 7A is a graph of illustrating a relationship of time and threshold voltage Vth with varying source voltage Vs at a fixed gate voltage Vg in a SONOS memory device according to a first operational embodiment of the present invention.

FIG. 7A is a graph illustrating a relationship of erasing time and threshold voltage Vth for various source voltages Vs of 3V, 4V, and 5V at a fixed gate voltage Vg of −6V and a fixed drain voltage Vd of 0V in a SONOS memory device according to a first operational embodiment of the present invention.

Referring to FIG. 7A, the erasing time decreases for a given threshold voltage Vth, since the difference between the threshold voltage Vth and the source voltage Vs increases as the source voltage Vs increases. The number of hot holes injected from the source electrode is proportional to the difference between the source voltage Vs and the gate voltage Vg.

Figure 7B:
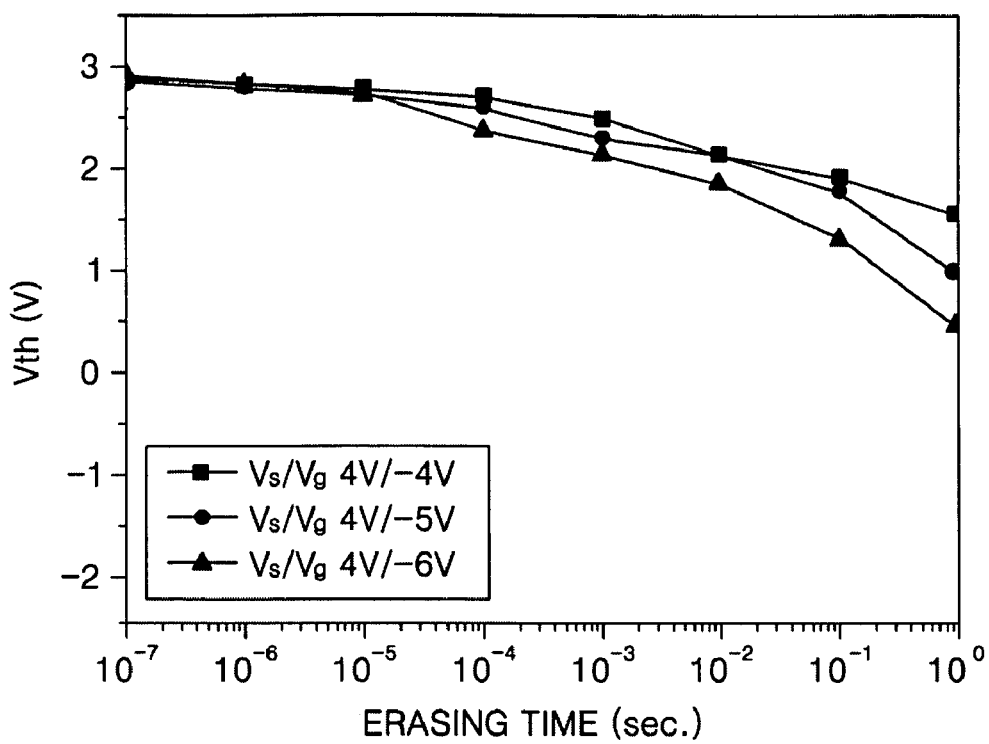
FIG. 7B is a graph illustrating a relationship of erasing time and threshold voltage Vth with varying gate voltage Vg at a fixed source voltage Vs in a SONOS memory device according to a second operational embodiment of the present invention.

FIG. 7B is a graph illustrating a relationship of erasing time and threshold voltage Vth for various gate voltages Vg of −4V, −5V, and −6V at a fixed source voltage Vs of 4V and a fixed drain voltage Vd of 0V in a SONOS memory device according to a second operational embodiment of the present invention.

Referring to FIG. 7B, the erasing time decreases for a given threshold voltage Vth since the difference between the gate voltage Vg and the source voltage Vs increases as the gate voltage Vg increases. The variation of the erasing time with respect to the variation of the source voltage Vs or the gate voltage Vg is similar in the graphs depicted in FIGS. 7A and 7B, and the erasing speed is similar to the erasing speed in a conventional NAND flash memory device.

Figure 7C:
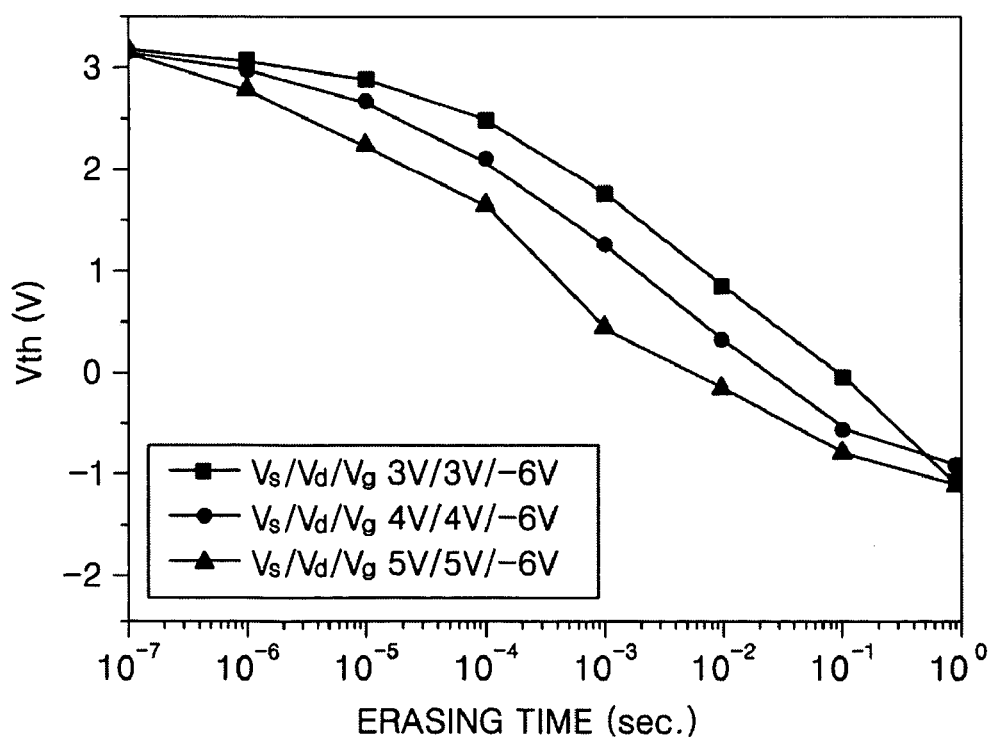
FIG. 7C is a graph illustrating a relationship of erasing time and threshold voltage Vth with varying source voltage Vs and drain voltage Vd at a fixed gate voltage Vg in a SONOS memory device according to a third operational embodiment of the present invention.

FIG. 7C is a graph illustrating a relationship of erasing time and threshold voltage Vth for various source voltages Vs and drain voltages Vd of 3V, 4V, and 5V, respectively, at a fixed gate voltage Vg of −6V in a SONOS memory device according to a third operational embodiment of the present invention.

As can be seen in the plots in the graph of FIG. 7C, the erasing time is significantly reduced for a given threshold voltage Vth as compared with the plots in FIGS. 7A and 7B. This indicates that the hot hole injection from both the source and drain electrodes is more effective than injecting from just one of the electrodes.

Figure 8:
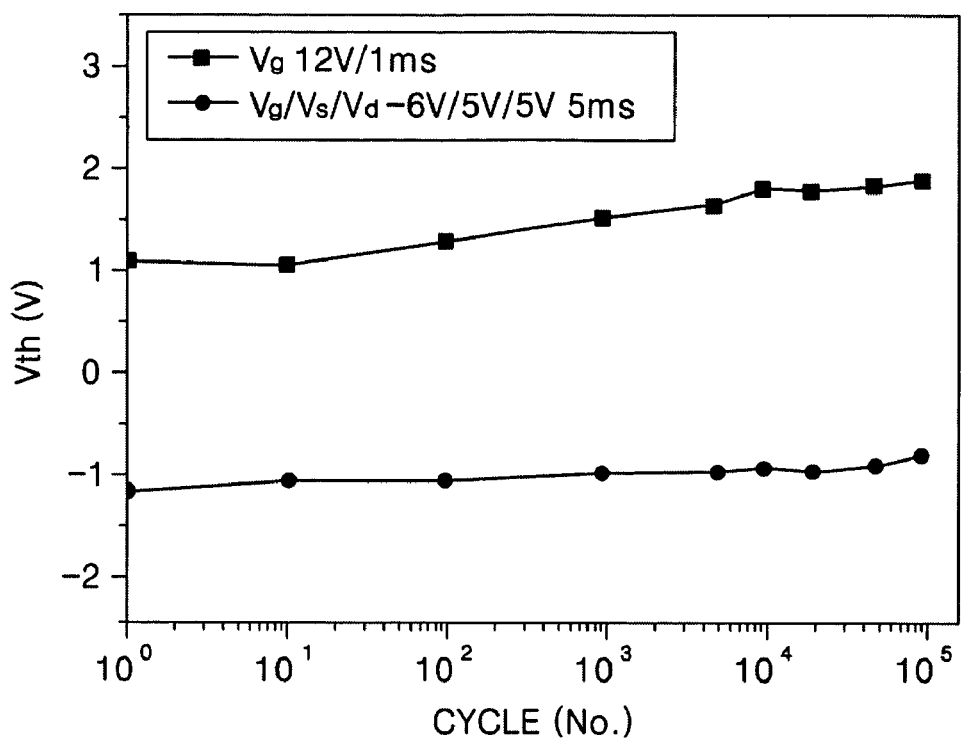
FIG. 8 is a graph showing a variation of threshold voltage Vth according to the cycle of recording and erasing in a SONOS memory device according to an embodiment of the present invention.

FIG. 8 is a graph of a variation in threshold voltage Vth versus a number of cycles of recording using a FN current and erasing using a HHI method in a SONOS memory device according to the third operational embodiment of the present invention.

Figure 9:
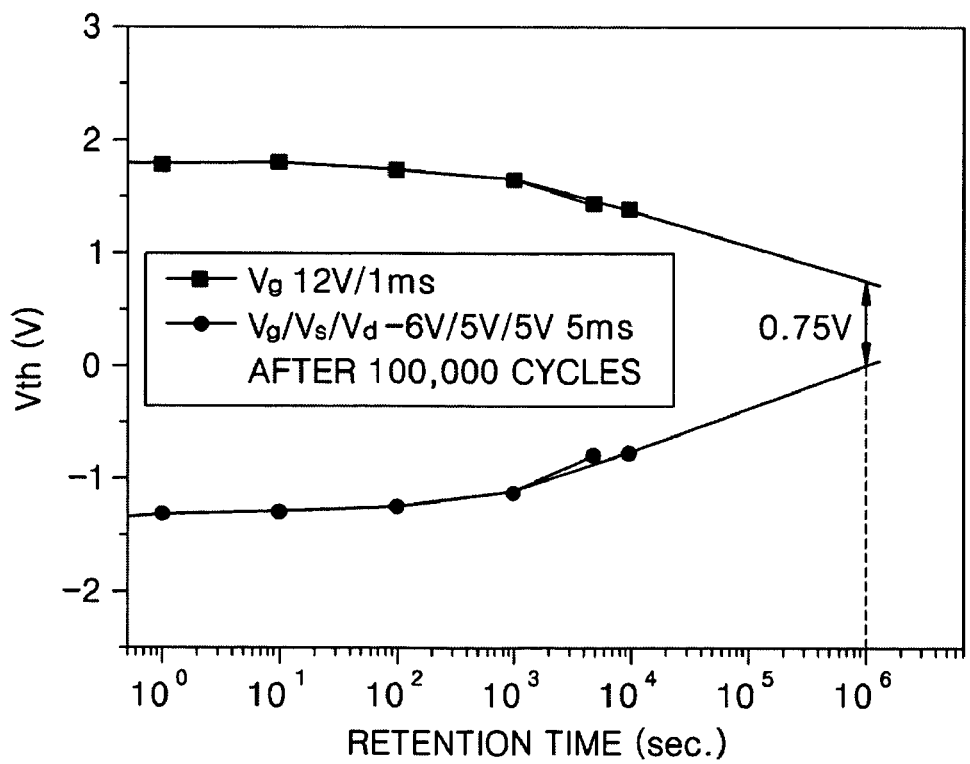
FIG. 9 is a graph showing a relationship between retention time and the threshold voltage Vth after cycles of recording and erasing in a SONOS memory device according to an embodiment of the present invention.

FIG. 9 is a graph of retention time versus threshold voltage Vth after more than $10^5$ recording and erasing cycles in a SONOS memory device according to the third operational embodiment of the present invention.

Referring to FIG. 8, a gate voltage Vg of 12V was applied for 1 ms for recording data, and a gate voltage Vg of −6V, a source voltage Vs and a drain voltage Vd of 5V were applied for 5 ms for erasing. Between $10^4$ and $10^5$ recording and erasing cycles, the threshold voltages remained about 1~2 V when recording data and about −1.3~−1 V when erasing data. That is, the SONOS memory device according to an embodiment of the present invention has high reliability.

Referring to FIG. 9, after one hundred thousand cycles of recording and erasing, the difference between the threshold voltages after a retention time of $10^6$ seconds is about 0.75V. Therefore, the SONOS memory device according to an embodiment of the present invention functions as a proper flash memory device. If a sensing margin of the data erasing is defined as 0.5V, the erasing method according to the present invention produces a voltage in an effective range.

A memory device according to embodiments of the present invention can reliably erase data by injecting hot holes into a nitride film when a strong electric field is formed between the source and drain electrodes and the gate electrode after adding a bit line contacting the source and drain.

As described above, the SONOS memory device according to embodiments of the present invention and the method of erasing can erase data at a high speed.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon oxide nitride oxide silicon (SONOS) memory device connected to a bit line and a word line, comprising:
   a substrate having first and second electrodes formed therein, at least one of the first and second electrodes electrically connected to the bit line;
   a tunnel oxide layer on the substrate;
   a nitride film on the tunnel oxide layer; and
   a gate electrode on the nitride film and electrically connected to the word line;
   wherein data is stored in the SONOS memory device by trapping charge carriers of a first sign in the nitride film and data is erased from the SONOS memory device by injecting charge carriers of a second sign, opposite the first sign, into the nitride film across the tunnel oxide layer,
   wherein the charge carriers of the second sign are generated by an electric field formed between at least one of the first and second electrodes and at least one of the nitride film and the bit line.

2. The SONOS memory device as claimed in claim 1, wherein a voltage of a first polarity is applied to each of the first and the second electrodes and a voltage of a second polarity, opposite the first polarity, is applied to the gate electrode.

3. The SONOS memory device as claimed in claim 2, wherein the voltage of the first polarity applied to each of the first and the second electrodes has a same value for both the first and second electrodes.

4. The SONOS memory device as claimed in claim 1, wherein the bit line contacts one of the electrodes such that charge carriers of the second sign from one of the first and the second electrode can be injected into the bit line.

5. The SONOS memory device as claimed in claim 1, wherein the bit line includes a first bit line and a second bit line respectively contacting the first and the second electrodes such that charge carriers of the second sign from the first and second electrodes can be injected into the first and second bit lines.

6. The SONOS memory device as claimed in claim 1, further comprising a blocking oxide film for shielding electron tunneling, the blocking oxide film being interposed between the nitride film and the gate electrode.

7. The SONOS memory device as claimed in claim 1, wherein data is recorded by tunneling electrons of a Fowler-Nordheim current into the nitride film across the tunnel oxide layer.

8. The SONOS memory device as claimed in claim 7, wherein a negative voltage is applied to the gate electrode.

9. The SONOS memory device as claimed in claim 1, wherein the data is erased by tunneling the charge carriers of the second sign into the nitride film by a Fowler-Nordheim current flowing across the tunnel oxide layer.

10. The SONOS memory device as claimed in claim 1, wherein between the first and second electrodes a channel length is less than 100 nm.

11. The SONOS memory device as claimed in claim 1, wherein the charge carriers of the second sign are hot holes.

12. An array of silicon oxide nitride oxide silicon (SONOS) memory devices, comprising:

at least a first memory device and a second memory device, each memory device being connected to a bit line and a word line, and including first and second electrodes, at least one of the first and second electrodes electrically connected to the bit line;

a tunnel oxide layer on the substrate, a nitride film on the tunnel oxide layer, and a gate electrode on the nitride film and electrically connected to the word line, wherein data is stored in the SONOS memory device by trapping charge carriers of a first sign in the nitride film and data is erased from the SONOS memory device by injecting charge carriers of a second sign, opposite the first sign, into the nitride film across the tunnel oxide layer, wherein the charge carriers of the second sign are generated by an electric field formed between at least one of the first and second electrodes and at least one of the nitride film and the bit line; and wherein the second electrode of the first memory device serves as the first electrode of the second memory device.

13. The array of SONOS memory devices as claimed in claim 12, wherein the first and second memory devices are connected to a single bit line.

14. The array of SONOS memory devices as claimed in claim 12, wherein the bit line includes a first bit line and a second bit line, respectively connected to each of the first and second electrodes.

15. The array of SONOS memory devices as claimed in claim 12, further comprising a third SONOS memory device sharing the word line of one of the first and second SONOS memory devices.

16. The array of SONOS memory devices as claimed in claim 12, wherein the charge carriers of the second sign are hot holes.

* * * * *